US008913452B2

(12) United States Patent
Kim

(10) Patent No.: US 8,913,452 B2
(45) Date of Patent: Dec. 16, 2014

(54) SEMICONDUCTOR DEVICE AND SEMICONDUCTOR MEMORY DEVICE

(75) Inventor: Dong-Kyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 267 days.

(21) Appl. No.: 13/486,773

(22) Filed: Jun. 1, 2012

(65) Prior Publication Data

US 2013/0322195 A1   Dec. 5, 2013

(51) Int. Cl.
*G11C 7/00* (2006.01)

(52) U.S. Cl.
USPC .......................................... 365/203; 365/205

(58) Field of Classification Search
CPC ..... G11C 11/4074; G11C 7/1048; G11C 8/08
USPC .................................................. 365/203, 205
See application file for complete search history.

(56) References Cited

U.S. PATENT DOCUMENTS 7,379,337 B2 *  5/2008  Park ......................... 365/185.18
8,441,877 B2 *  5/2013  Choi et al. .................... 365/203

* cited by examiner

*Primary Examiner* — Son Dinh
*Assistant Examiner* — Nam Nguyen
(74) *Attorney, Agent, or Firm* — IP & T Group LLP

(57) ABSTRACT

A semiconductor device includes: a data transmission unit configured to transmit differential data between a first data line pair and a second data line pair; and first and second power supply voltage generation units configured to generate precharging voltages to be applied to the first and second data line pairs, respectively.

10 Claims, 2 Drawing Sheets

SEMICONDUCTOR DEVICE AND SEMICONDUCTOR MEMORY DEVICE

BACKGROUND

1. Field

Exemplary embodiments of the present invention relate to a semiconductor design technology, and more particularly, to a semiconductor device including a data line pair to which differential data are transmitted and a semiconductor memory device.

2. Description of the Related Art

In general, a semiconductor memory device represented by DRAM includes more than tens of millions of memory cells for storing data, and stores or output data according to a command requested by a central processing unit such as a chip set. That is, when the chip set requests a write operation, data inputted through a data pad is transmitted through an input path and stored in a corresponding memory cell, and when the chip set requests a read operation, data stored in a corresponding memory cell is transmitted to a data pad through an output path and then outputted. Therefore, the semiconductor memory device includes input paths and output paths which are coupled to more than tens of millions of memory cells and configured to transmit data.

Meanwhile, the semiconductor memory device has developed according to the trend of large capacity, high speed, and miniaturization. In order to quickly process a large quantity of data in a state in which the chip size of the semiconductor memory device is gradually reduced, data lines composing the input and output paths should be efficiently controlled. For this operation, a variety of control methods are being currently researched. Hereafter, the present invention will be described in connection with a method for controlling such data lines.

SUMMARY

An embodiment of the present invention is directed to a semiconductor device and a semiconductor memory device which provide precharging voltages to data lines composing input/output paths, respectively.

Another embodiment of the present invention is directed to a semiconductor device and a semiconductor memory device which control precharging operation time points of plural data lines.

In accordance with an embodiment of the present invention, a semiconductor device includes: a data transmission unit configured to transmit differential data between a first data line pair and a second data line pair; and first and second power supply voltage generation units configured to generate precharging voltages to be applied to the first and second data line pairs, respectively.

The semiconductor device may further include a first precharging driving unit configured to receive the precharging voltage generated by the first power supply voltage generation unit and precharge the first data line pair; and a second precharging driving unit configured to receive the precharging voltage generated by the second power supply voltage generation unit and precharge the second data line pair.

In accordance with another embodiment of the present invention, a semiconductor memory device includes: a bit line sense amplification unit configured to sense and amplify data stored in a memory cell and transmit the amplified data to a first data line pair; a data transmission unit configured to transmit the data transmitted through the first data line pair to a second data line pair in response to a transmission control signal; an output sense amplification unit configured to sense and amplify the data transmitted through the second data line pair and output the amplified data to a data pad; and first and second power supply voltage generation units configured to generate precharging voltages to be applied to the first and second data line pairs, respectively.

The first power supply voltage generation unit may be disposed at a first area adjacent to the first data line pair, and the second power supply voltage generation unit may be disposed at a second area adjacent to the second data line pair.

DETAILED DESCRIPTION

Figure 1:
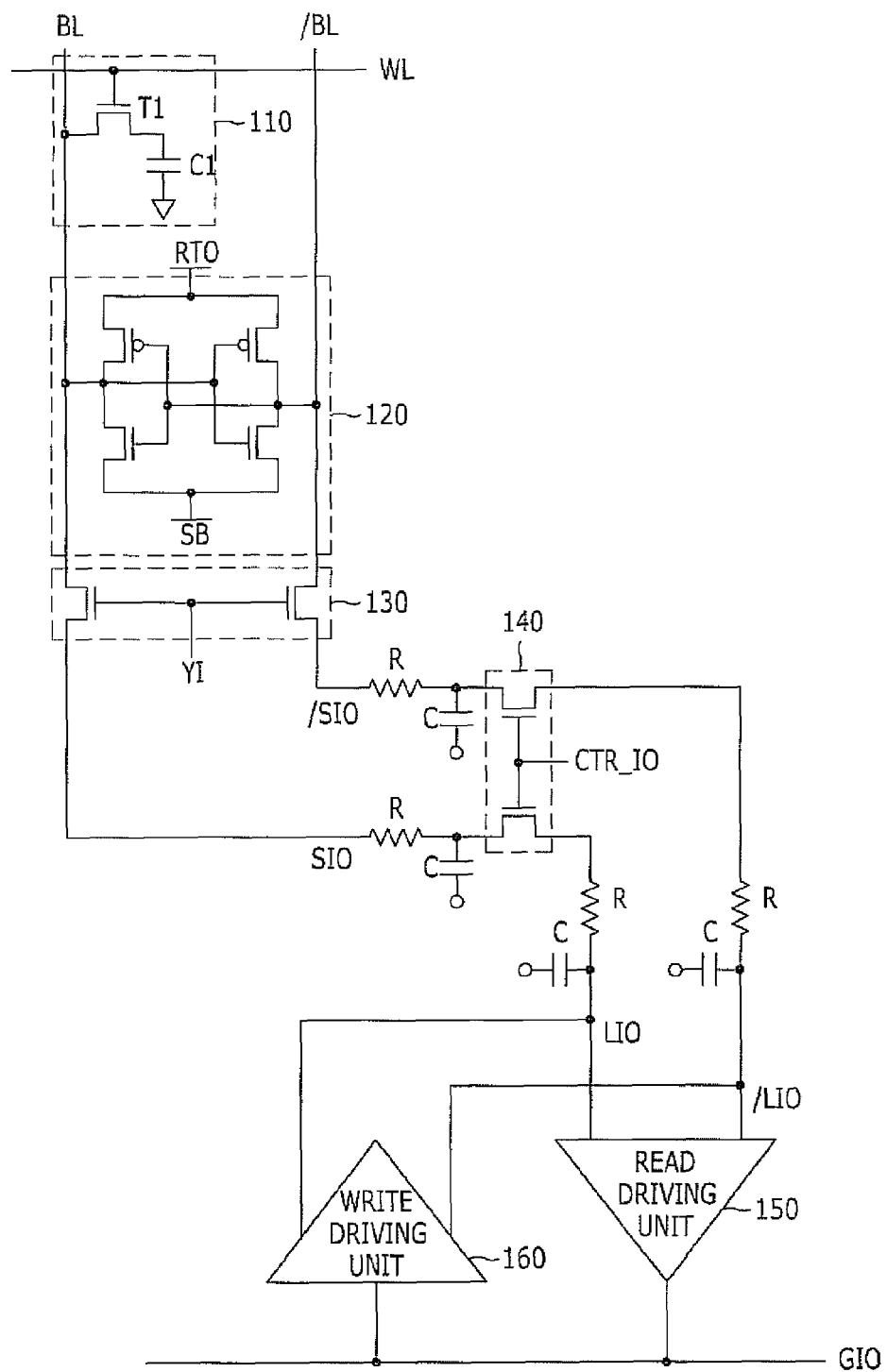
FIG. 1 is a diagram explaining the operation of a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram explaining an operation of a semiconductor memory device in accordance with an embodiment of the present invention.

Hereafter, referring to FIG. 1, a write operation of the semiconductor memory device will be briefly described.

First, when a word line selected by decoding a row address inputted according to an active command is enabled, a cell transistor T1 of a memory cell 110 is turned on, and data stored in a cell capacitor C1 is charge-shared between precharged bit line and bit line bar BL and /BL. At this time, between the bit line and bit line bar BL and /BL, a minute potential difference occurs depending on the data stored in the cell capacitor C1. That is, differential data are formed in the bit line pair composed of the bit line and bit line bar BL and /BL. Although will be described below, the differential data formed in such a manner are transmitted to a segment data line pair and a local data line pair.

A bit line sense amplification unit 120 is configured to sense and amplify the minute potential difference between the bit line and bit line bar BL and /BL. For example, when the potential of the bit line BL is higher than that of the bit line bar /BL, the bit line BL is amplified to a pull-up power voltage RTO, and the bit line bar /BL is amplified to a pull-down power voltage SB. On the other hand, when the potential of the bit line BL is lower than that of the bit line bar /BL, the bit line BL is amplified to the pull-down power voltage SB, and the bit line bar /BL is amplified to the pull-up power voltage RTO.

Meanwhile, when a column selection signal YI is activated by decoding a column address inputted according to a column command, a transistor of a column selection unit 130 is turned on to couple the bit line and bit line bar BL and /BL to segment data line and segment data line bar SIO and /SIO, respectively. Therefore, data amplified in the bit line BL is transmitted to the segment data line SIO, and data amplified in the bit line bar /BL is transmitted to the segment data line bar /SIO.

A transistor of an input/output switching unit 140 is turned on in response to an input/output control signal CTR_IO. Accordingly, the segment data line and segment data line bar SIO and /SIO are coupled to local data line and local data line bar LIO and /LIO, respectively. Therefore, the data transmitted to the segment data line SIO is transmitted to the local data line LID, and the data transmitted to the segment data line bar /SIO is transmitted to the local data line bar /LIO.

A write driving unit 150 is configured to drive a global data line GIO according to the data transmitted through the local data line and local data line bar LIO and LIO.

In short, the data stored in the memory cell 110 are transmitted to the segment data line and segment data line bar SIO and /SIO through the bit line and bit line bar BL and /BL in response to the column selection signal YI, the data transmitted to the segment data line and segment data line bar SIO and /SIO are transmitted to the local data line and local data line bar LIO and /LIO through the input/output switching unit 140, and the data transmitted to the local data line and local data line bar LIO and /LIO are transmitted to the global data line GIO by the write driving unit 150. The data transmitted in such a manner are finally outputted to the outside through a corresponding data pad which is not illustrated in FIG. 1.

Meanwhile, data applied from outside during a write operation are transmitted in the opposite direction of the read operation. That is, the data applied through the input/output pad are transmitted to the local data line and local data line bar LIO and /LIO through a write driving unit 160 from the global data line GIO, the data transmitted to the local data line and local data line bar LIO and /LIO are transmitted to the segment data line and segment data line bar SIO and /SIO, and the data transmitted to the segment data line and segment data line bar SIO and /SIO are transmitted to the bit line and bit line bar BL and /BL. The data transmitted in such a manner are finally stored in the memory cell 110.

Figure 2:
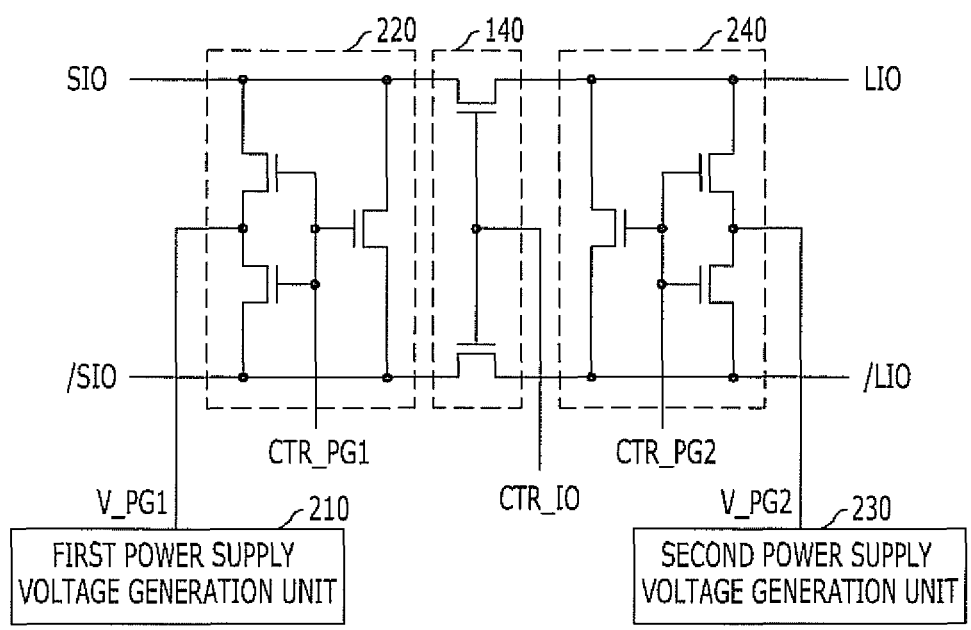
FIG. 2 is a diagram explaining precharging operations of segment data line and segment data line bar SIO and /SIO and local data line and local data line bar LIO and /LIO.

FIG. 2 is a diagram explaining precharging operations of the segment data line and segment data line bar SIO and /SIO and the local data line and local data line bar LIO and /LIO. For convenience of explanation, like reference numerals will be attached to the same components as those of FIG. 1.

Referring to FIG. 2, the semiconductor memory device in accordance with the embodiment of the present invention includes the input/output switching unit 140, a first power supply voltage generation unit 210, a first precharging driving unit 220, a second power supply voltage generation unit 230, and a second precharging driving unit 240.

The input/output switching unit 140 is configured to transmit data between the segment data line and segment data line bar SIO and /SIO and the local data line and local data line bar LIO and /LIO. The data transmission between the segment data line and segment data line bar SIO and /SIO and the local data line and local data line bar LIO and /LIO is performed in response to an input/output control signal CTR_IO. The input/output switching unit 140 is the same component as that illustrated in FIG. 1.

The first power supply voltage generation unit 210 is configured to generate a first precharging voltage V_PG1 to be applied to the segment data line and segment data line bar SIO and /SIO, and the first precharging driving unit 220 is configured to precharge the segment data line and segment data line bar SIO and /SIO with the first precharging voltage V_PG1 in response to a first precharging control signal CTR_PG1. The second power supply voltage generation unit 230 is configured to generate a second precharging voltage V_PG2 to be applied to the local data line and local data line bar LIO and /LIO, and the second precharging driving unit 240 is configured to precharge the local data line and local data line bar LIO and /LIO with the second precharging voltage V_PG2 in response to a second precharging control signal CTR_PG2. As illustrated in FIG. 2, the first power supply voltage 210 is disposed at an area adjacent to the segment data line and segment data line bar SIO and /SIO, and the second power supply voltage 230 is disposed at an area adjacent to the local data line and local data line bar LIO and /LIO.

Meanwhile, the segment data line and segment data line bar SIO and /SIO and the local data line and local data line bar LIO and /LIO in accordance with the embodiment of the present invention may perform a precharging operation before data are applied and transmitted, and the precharging operation may be efficiently controlled without other limitations.

That is, in the semiconductor memory device in accordance with the embodiment of the present invention, the first and second power supply voltage generation units 210 and 230 separately generate the first and second precharging voltages V_PG1 and V_PG2, respectively, and the first and second precharging V_PG1 and V_PG2 generated in such a manner are applied to the segment data line and segment data line bar SIO and /SIO and the local data line and local data line bar LIO and /LIO, respectively. Therefore, the first and second precharging control signals CTR_PG1 and CTR_PG2 for controlling the precharging operation may be controlled regardless of whether the input/output control signal CTR_IO is activated or not.

In other words, the first and second precharging control signals CTR_PG1 and CTR_PG2 may be freely controlled without particular limitations, during the precharging operation before the application of data, and the activation time points of the first and second precharging control signals CTR_PG1 and CTR_PG2 may also be freely controlled. Here, the activation time points of the first and second precharging control signals CTR_PG1 and CTR_PG2 may differ depending on an operation mode. For example, during the read operation, the segment data line and segment data line bar SIO and /SIO may be precharged before the local data line and local data line bar LIO and /LIO are precharged. On the contrary, during the write operation, the segment data line and segment data line bar SIO and /SIO may be precharged after the local data line and local data line bar LIO and /LIO are precharged.

As described above, the semiconductor memory device in accordance with the embodiment of the present invention separately generate the precharging voltages which are to be applied to the segment data line and segment data line bar SIO and /SIO and the local data line and local data line bar LIO and /LIO, respectively. Therefore, the segment data line and segment data line bar SIO and /SIO and the local data line and local data line bar LIO and /LIO may receive stable precharging voltages, respectively. Furthermore, since the application time points of the precharging voltages may be controlled differently from each other, a peak current does not occur during the precharging operation. Furthermore, when the data lines are separately controlled in such a manner, it is possible to minimize noise reflected into the corresponding lines.

In accordance with the embodiment of the present invention, the semiconductor memory device includes the precharging voltage generation units in correspondence to data lines composing input/output paths, respectively. Therefore, it is possible to stably secure precharging voltages to be applied to the respective data lines. Furthermore, the precharging operation time points of the respective data lines may be controlled to guarantee a stable circuit operation.

As the precharging voltages to be applied to the data lines are sufficiently secured, it is possible to stably perform the precharging operations and the data transmission operations of the data lines.

Furthermore, since the respective data lines are precharged at different time points, a peak current does not occur. Accordingly, it is possible to guarantee a stable circuit operation of the semiconductor memory device.

While the present invention has been described with respect to the specific embodiments, it will be apparent to those skilled in the art that various changes and modifications may be made without departing from the spirit and scope of the invention as defined in the following claims.

In the above-described semiconductor memory device which performs an operation of reading and writing data from and into memory cells, the components related to the precharging operations of the segment data line and segment data line bar SIO and /SIO and the local data line and local data line bar LIO and /LIO have been described as an example. However, the prevent invention may be applied to a semiconductor device including first and second data line pairs for transmitting data.

Furthermore, the positions and kinds of logic gates and transistors described in this embodiment may be differently implemented according to the polarity of an inputted signal.

What is claimed is:

1. A semiconductor device comprising:
   a data transmission unit configured to transmit differential data between a first data line pair and a second data line pair; and
   first and second power supply voltage generation units that separately generate precharging voltages to the first and second data line pairs, respectively, in response to a first precharging control signal and a second precharging control signal that controls a precharging operation regardless of an activation of an input/output control signal.

2. The semiconductor device of claim 1, further comprising:
   a first precharging driving unit configured to receive the precharging voltage generated by the first power supply voltage generation unit and precharge the first data line pair; and
   a second precharging driving unit configured to receive the precharging voltage generated by the second power supply voltage generation unit and precharge the second data line pair.

3. The semiconductor device of claim 2, wherein an activation time point of the first precharging driving unit is different from that of the second precharging driving unit so that during a read operation the first data line pair is precharged before the second data line pair and during a write operation the first data line pair is precharged after the second data line pair.

4. A semiconductor memory device comprising:
   a bit line sense amplification unit configured to sense and amplify data stored in a memory cell and transmit the amplified data to a first data line pair;
   a data transmission unit configured to transmit the data transmitted through the first data line pair to a second data line pair in response to a transmission control signal;
   an output sense amplification unit configured to sense and amplify the data transmitted through the second data line pair and output the amplified data to a data pad; and
   first and second power supply voltage generation units that separately generate precharging voltages to be applied to the first and second data line pairs, respectively, in response to a first precharging control signal and a second precharging control signal that controls a precharging operation regardless of an activation of an input/output control signal.

5. The semiconductor memory device of claim 4, further comprising a column selection unit configured to transmit an output signal of the bit line sense amplification unit to the first data line pair in response to a column command.

6. The semiconductor memory device of claim 4, wherein, during a read operation, the first data line pair is precharged before the second data line pair is precharged.

7. The semiconductor memory device of claim 4, wherein, during a write operation, the first data line pair is precharged after the second data line pair is precharged.

8. The semiconductor memory device of claim 4, further comprising:
   a first precharging driving unit configured to receive the precharging voltage generated by the first power supply generation unit and precharge the first data line pair; and
   a second precharging driving unit configured to receive the precharging voltage generated by the second power supply generation unit and precharge the second data line pair.

9. The semiconductor memory device of claim 8, wherein an activation time point of the first precharging driving unit is different from that of the second precharging driving unit so that during a read operation the first data line pair is precharged before the second data line pair and during a write operation the first data line pair is precharged after the second data line pair.

10. The semiconductor memory device of claim 4, wherein the first power supply voltage generation unit is disposed at a first area adjacent to the first data line pair, and the second power supply voltage generation unit is disposed at a second area adjacent to the second data line pair.

* * * * *